(12) United States Patent
Chang et al.

(10) Patent No.: US 11,762,293 B2
(45) Date of Patent: Sep. 19, 2023

(54) FABRICATING METHOD OF REDUCING PHOTORESIST FOOTING

(71) Applicant: UNITED MICROELECTRONICS CORP., Hsin-Chu (TW)

(72) Inventors: Hao-Hsuan Chang, Kaohsiung (TW); Da-Jun Lin, Kaohsiung (TW); Yao-Hsien Chung, Kaohsiung (TW); Ting-An Chien, Tainan (TW); Bin-Siang Tsai, Changhua County (TW); Chih-Wei Chang, Tainan (TW); Shih-Wei Su, Tainan (TW); Hsu Ting, Tainan (TW); Sung-Yuan Tsai, Yunlin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 219 days.

(21) Appl. No.: 17/316,736

(22) Filed: May 11, 2021

(65) Prior Publication Data

US 2022/0365433 A1  Nov. 17, 2022

(51) Int. Cl.
*G03F 7/075* (2006.01)
*G03F 7/20* (2006.01)
*C23C 16/34* (2006.01)

(52) U.S. Cl.
CPC .......... *G03F 7/0755* (2013.01); *G03F 7/2043* (2013.01); *C23C 16/345* (2013.01)

(58) Field of Classification Search
CPC . G03F 7/0755; G03F 7/16; G03F 7/11; G03F 7/2043; C23C 16/345
See application file for complete search history.

(56) References Cited

U.S. PATENT DOCUMENTS

2009/0311868 A1* 12/2009 Hayashi ............ H01L 21/31105
                                              438/706
2013/0244414 A1*  9/2013 Song ............... H01L 21/823462
                                              438/591

FOREIGN PATENT DOCUMENTS

TW        I333674       11/2010

OTHER PUBLICATIONS

Warner Kern, The Evolution of Silicon Wafer Cleaning Technology (Jun. 1990) Journal of the Electrochemical Society, vol. 137, pp. 1887-1891 (Year: 1990).*
Brunet et al, Etching and Chemical Control of the Silicon Nitride Surface, ACS Appl. Mater. Interfaces, 2017, 9, 3, 3075-3084 (Year: 2017).*

* cited by examiner

*Primary Examiner* — Mark F. Huff
*Assistant Examiner* — Andrew Preston Traywick
(74) *Attorney, Agent, or Firm* — Winston Hsu

(57) ABSTRACT

A fabricating method of reducing photoresist footing includes providing a silicon nitride layer. Later, a fluorination process is performed to graft fluoride ions onto a top surface of the silicon nitride layer. After the fluorination process, a photoresist is formed to contact the top surface of the silicon nitride layer. Finally, the photoresist is patterned to remove at least part of the photoresist contacting the silicon nitride layer.

11 Claims, 4 Drawing Sheets

FABRICATING METHOD OF REDUCING PHOTORESIST FOOTING

BACKGROUND OF THE INVENTION

1. Field of the Invention

The present invention relates to a fabricating method of reducing photoresist footing, and more particularity to a fabricating method of reducing photoresist footing by a fluorination process.

2. Description of the Prior Art

According to a conventional lithography, a substrate is coated uniformly with a photoresist which is a radiation-sensitive film. Then, a light source illuminates selected areas of the substrate through a photo mask containing a particular pattern. The illuminated area becomes soluble in a particular solvent developer.

To make the photoresist soluble, a chemical distinction is provided between exposed and unexposed photoresist. This is primarily done through the use of photo acid generators (PAG), photoactive materials that form an acid upon UV exposure at the proper wavelength. That acid buildup allows for selective removal of exposed photoresist, while leaving unexposed resist in place.

One problem is that the acid generated upon exposure diffuses into underlying layers and reacts with a surface of the underlying layer. Therefore, sufficient acid may not remain to facilitate the removal of all of the exposed photoresist. Some of the exposed photoresist is then not removed from the surface of the underlying layer becomes photoresist scum or photoresist footing that can cause fabrication failures.

SUMMARY OF THE INVENTION

In view of this, the present invention provides a fabricating method of reducing photoresist footing to solve the above-mentioned problems.

A fabricating method of reducing photoresist footing includes providing a silicon nitride layer. Later, a fluorination process is performed to graft fluoride ions onto a top surface of the silicon nitride layer. After the fluorination process, a photoresist is formed to contact the top surface of the silicon nitride layer. Finally, the photoresist is patterned to remove at least part of the photoresist contacting the silicon nitride layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 depict a fabricating method of reducing photoresist footing according to a first preferred embodiment of the present invention, wherein:

FIG. 2 is a fabricating stage following FIG. 1; and
FIG. 3 is a fabricating stage following FIG. 2.
FIG. 4 to FIG. 5 depict a fabricating method of reducing photoresist footing according to a second preferred embodiment of the present invention, wherein:
FIG. 5 is a fabricating stage following FIG. 4.

FIG. 6 to FIG. 10 depict a fabricating method of reducing photoresist footing according to a third preferred embodiment of the present invention wherein:
FIG. 7 is a fabricating stage following FIG. 6;
FIG. 8 is a fabricating stage following FIG. 7;
FIG. 9 is a fabricating stage following FIG. 8; and
FIG. 10 is a fabricating stage following FIG. 9.

DETAILED DESCRIPTION

Figure 1:
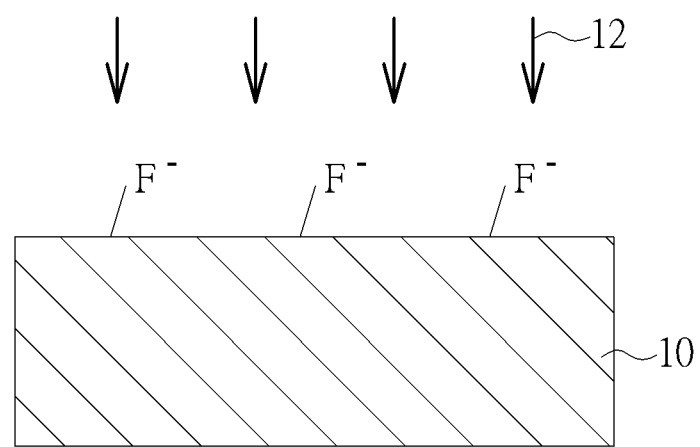
Figure 2:
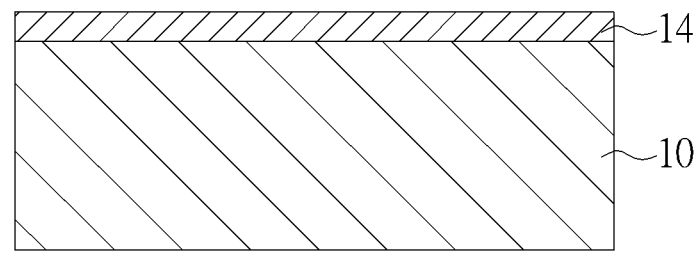
Figure 3:
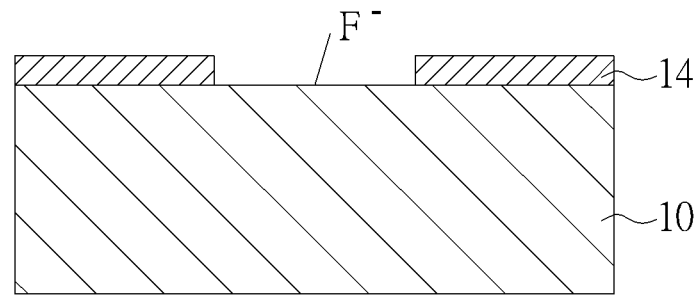

FIG. 1 to FIG. 3 depict a fabricating method of reducing photoresist footing according to a first preferred embodiment of the present invention.

As shown in FIG. 1, a fabricating method of reducing photoresist footing includes providing a silicon nitride layer 10. A surface of the silicon nitride layer 10 is usually bonded with hydroxides ($OH^-$) after the silicon nitride layer 10 went through any process containing water or other hydroxide-containing processes. Later, a fluorination process 12 is performed to graft fluoride ions onto a top surface of the silicon nitride layer 10. The fluorination process 12 includes a chemical oxide removal (COR) process, a dilute HF wet etching process or a fluorine-containing plasma treatment.

As shown in FIG. 2, after the fluorination process 12, a photoresist 14 is formed to contact the top surface of the silicon nitride layer 14. As shown in FIG. 3, the photoresist 14 is patterned by a photolithography process and part of the photoresist 14 contacting the silicon nitride layer 10 is removed. It is noteworthy that there is no footing occurred on the photoresist 14 after the photolithography process.

The compositions of photoresist 14 include a photoresist resin, a photoactive compound (PAC)/photo acid generator (PAG), a solvent and additives. In patterning process such as a photolithography process, the photoresist 14 is exposed to a light source such as KrF, ArF, VUV and EUV. During the exposure of photoresist 14, the PAC/PAG is converted to acid to promote solubility of the photoresist resin. Therefore, during the development process, portions of photoresist 14 which have been exposed to the light source are rendered soluble in alkali or water if the photoresist is a positive photoresist. If the photoresist is a negative photoresist, the portions of photoresist which have not been exposed to the light source are rendered soluble.

The fluoride ions grafted on the silicon nitride layer 10 form numerous silicon-fluorine single bonds (Si—F bonds). Si—F bonds make the surface of the silicon nitride layer 10 become hydrophobic and with high bonding energy. Therefore, during the exposure step, acid will not reacts with hydroxide bonded on the surface of the silicon nitride layer 10 because there are fluoride ions grafted on the silicon nitride layer 10. In this way, sufficient acid can be facilitated for the removal of photoresist 14. Scum or footing will not occur on photoresist 14 and the desired photoresist image of the photoresist 14 can be achieved.

Figure 4:
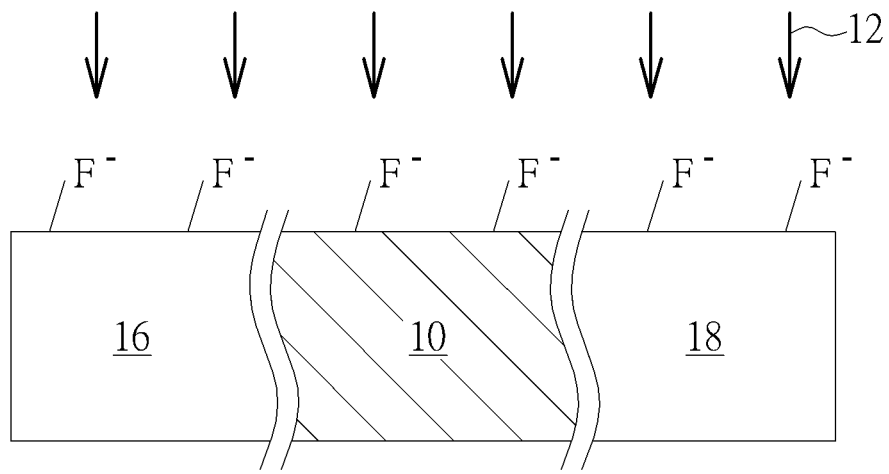
Figure 5:
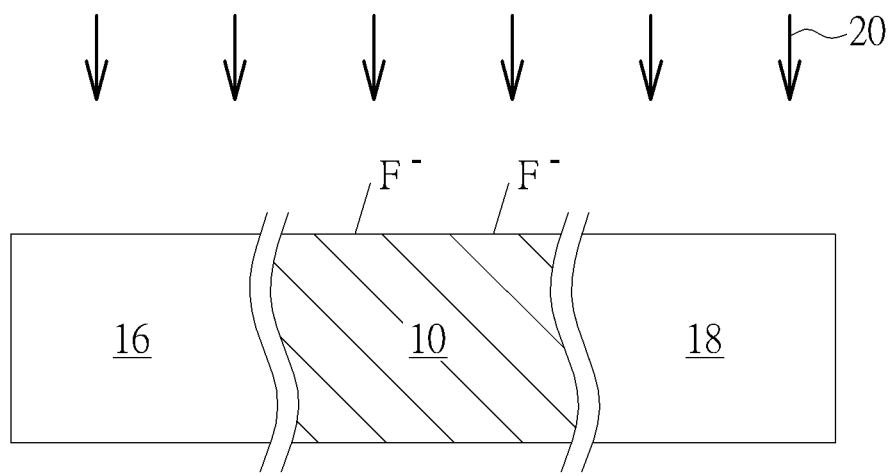

FIG. 4 to FIG. 5 depict a fabricating method of reducing photoresist footing according to a second preferred embodiment of the present invention, wherein elements which are substantially the same as those in the first preferred embodiment are denoted by the same reference numerals; an accompanying explanation is therefore omitted.

The fabricating method of reducing photoresist footing of the present invention can be applied to films with materials other than silicon nitride. As shown in FIG. 4, a silicon oxide layer 16 and a silicon layer 18 are disposed adjacent to a silicon nitride layer 10. Then, a fluorination process 12 is performed to the silicon oxide layer 16, the silicon layer 18, and the silicon nitride layer 10. During the fluorination process 12, a top surface of the silicon oxide layer 16, a top surface of the silicon layer 18 and a top surface of the silicon nitride layer 10 are grafted with fluoride ions. As shown in FIG. 5, a cleaning process 20 is performed to clean the silicon oxide layer 16, the silicon nitride layer 10 and the silicon layer 18 with a mixture of ammonium hydroxide, hydrogen peroxide, and water. During the cleaning process 20, the fluoride ions on the top surface of the silicon oxide layer 16 and on the top surface of the silicon layer 18 are removed by the cleaning process 20. According to another preferred embodiment of the present invention, the cleaning process 20 can be omitted, and the fluoride ions can be kept on the top surface of the silicon layer 18 and top surface of the silicon oxide layer 16.

Later, steps similar to the steps in FIG. 2 to FIG. 3 can be performed and therefore the fabricating figures are omitted herein. For example, after the cleaning process 20, a photoresist 14 can be formed to cover the silicon oxide layer 16, the silicon nitride layer 10 and the silicon layer 18. After that, the photoresist 14 can be patterned.

FIG. 6 to FIG. 10 depict a fabricating method of reducing photoresist footing according to a third preferred embodiment of the present invention.

Figure 6:
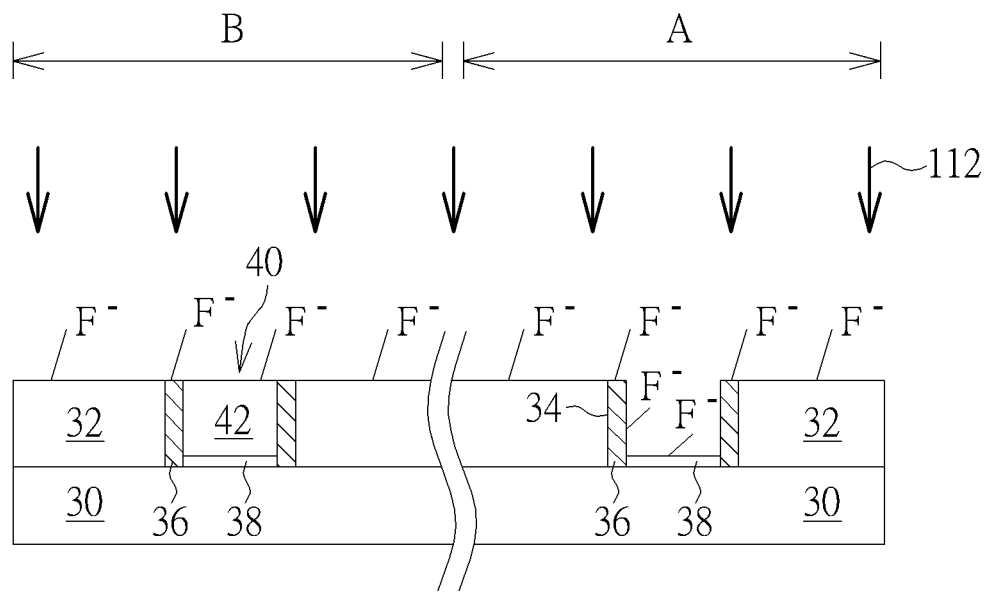

As shown in FIG. 6, a silicon substrate 30 is provided. An active region A and a peripheral region B are defined on the silicon substrate 30. A first silicon oxide layer 32 is disposed on the silicon substrate 30. A trench 34 is disposed within the first silicon oxide layer 32 within the active region A, a silicon nitride layer 36 is disposed in the trench 34 and surrounds the trench 34, and a second silicon oxide layer 38 is disposed at a bottom of the trench 34. The silicon nitride layer 36 serves as a spacer for a gate structure which will be formed afterwards. A gate structure 40 is disposed within the peripheral region B and embedded in the first silicon oxide layer 32. The gate structure 40 includes a polysilicon gate electrode 42, the silicon nitride layer 36, and the second silicon oxide layer 38. The second silicon oxide layer 38 serving as a gate dielectric layer is disposed between the polysilicon gate electrode 42 and the silicon substrate 30. The silicon nitride layer 36 serving as a spacer surrounds the polysilicon gate electrode 42.

Later, a fluorination process 112 is performed to the silicon substrate 30, the first silicon oxide layer 32, the silicon nitride layer 36, and the second silicon oxide layer 38. The fluorination process 112 can be performed by using a chemical oxide removal (COR) process, a dilute HF wet etching process or a fluorine-containing plasma treatment. During the fluorination process 112, the fluoride ions bonds on the silicon substrate 30, the first silicon oxide layer 32, the silicon nitride layer 36, the second silicon oxide layer 38 and the polysilicon gate electrode 42.

Figure 7:
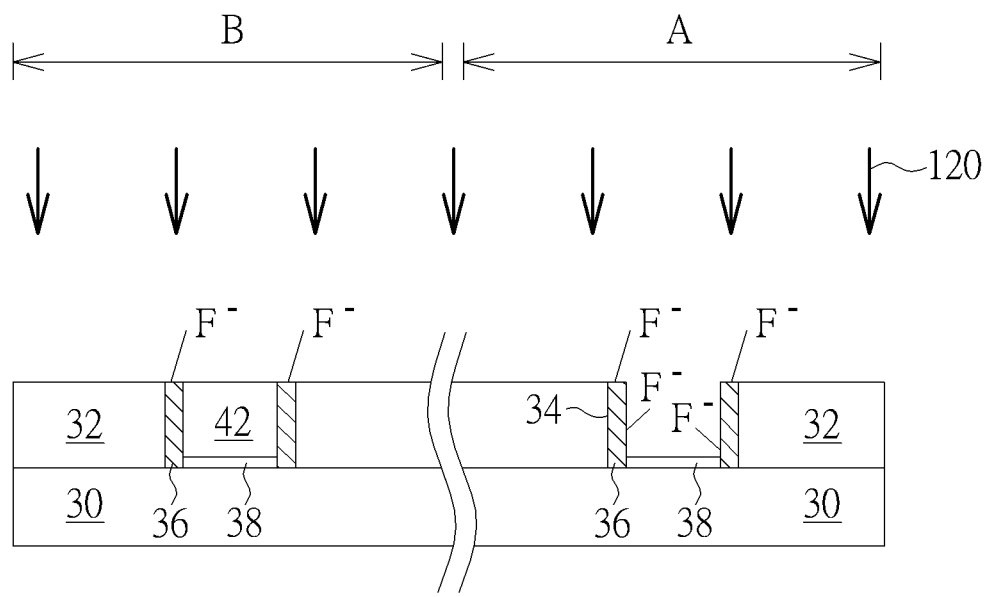

As shown in FIG. 7, a cleaning process 120 is performed to clean the silicon substrate 30, the first silicon oxide layer 32, the silicon nitride layer 36, the polysilicon gate electrode 42 and the second silicon oxide layer 38 with a mixture of ammonium hydroxide, hydrogen peroxide and water. After the cleaning process 120, fluoride ions bonded on the silicon substrate 30, the first silicon oxide layer 32 the polysilicon gate electrode 42 and the second silicon oxide layer 38 are removed. Only the fluoride ions grafted on the silicon nitride layer 36 are remained.

Figure 8:
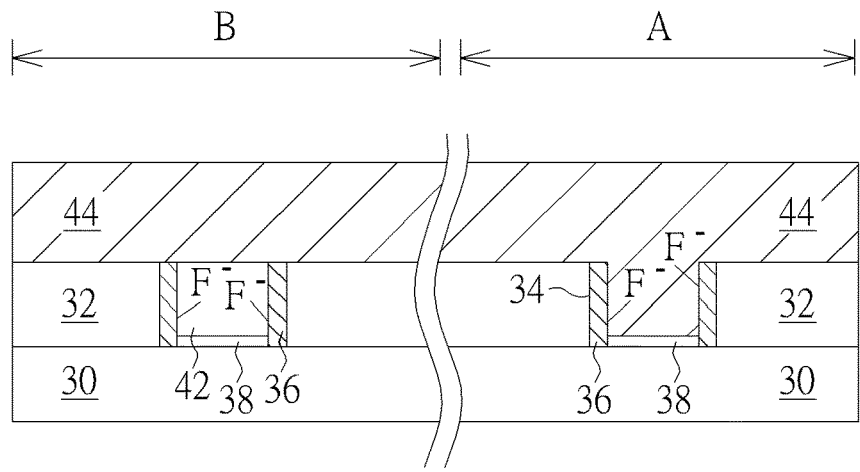
Figure 9:
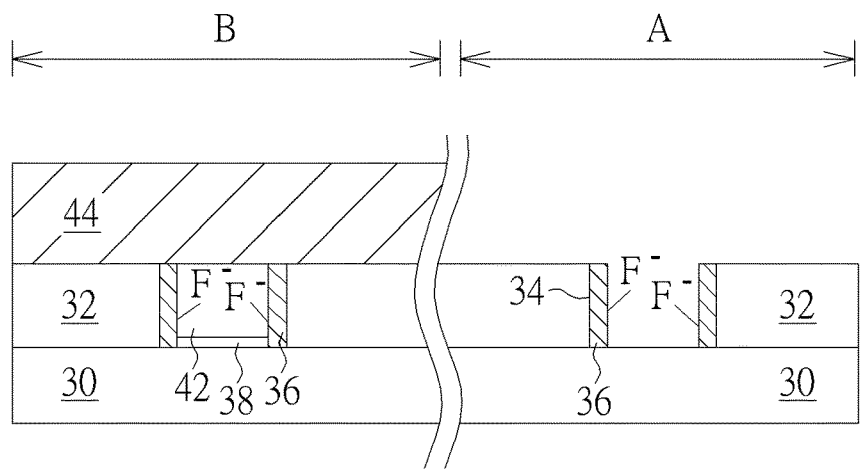
Figure 10:
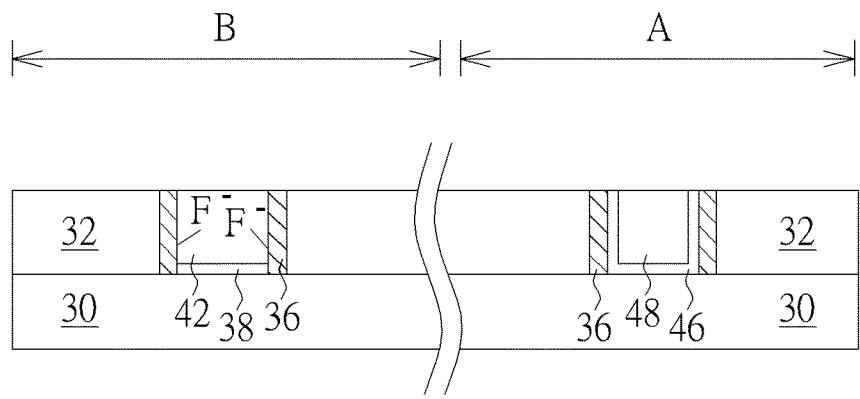

As shown in FIG. 8, a photoresist 44 is formed to contact the top surface of the silicon nitride layer 36, cover the active region A and the peripheral region B, and fills in the trench 34. As shown in FIG. 9, the photoresist 44 is patterned. In details, the photoresist 44 covered the active region A is removed, and the photoresist 44 covered the peripheral region B is remained. Now, the second silicon oxide layer 38 is exposed through the photoresist 44. Subsequently, the second silicon oxide layer 38 is removed entirely. As shown in FIG. 10, a gate dielectric layer 46 and a metal gate electrode 48 are formed in the trench 34.

In the present invention, a fluorination process is performed to graft fluoride ions onto a surface of the silicon nitride layer to make the surface of the silicon nitride become hydrophobic and with high bonding energy. In this way, acid will not react with hydroxides, and footings of the photoresist can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of reducing photoresist footing, comprising:
   providing a silicon nitride layer;
   performing a fluorination process to graft fluoride ions onto a top surface of the silicon nitride layer;
   after the fluorination process, forming a photoresist contacting the top surface of the silicon nitride layer; and
   patterning the photoresist to remove at least part of the photoresist contacting the top surface of the silicon nitride layer.

2. The fabricating method of reducing photoresist footing of claim 1, further comprising: before performing the fluorination process, providing a silicon oxide layer and a silicon layer.

3. The fabricating method of reducing photoresist footing of claim 2, wherein during the fluorination process, a top surface of the silicon oxide layer and a top surface of the silicon layer are grafted with fluoride ions.

4. The fabricating method of reducing photoresist footing of claim 3, further comprising:
   after the fluorination process and before forming the photoresist, performing a cleaning process to clean the silicon oxide layer, the silicon nitride layer and the silicon layer with a mixture of ammonium hydroxide, hydrogen peroxide, and water.

5. The fabricating method of reducing photoresist footing of claim 4, wherein the fluoride ions on the top surface of the silicon oxide layer and on the top surface of the silicon layer are removed by the cleaning process.

6. The fabricating method of reducing photoresist footing of claim 1, further comprising:
   providing a silicon substrate having an active region and a peripheral region, a first silicon oxide layer disposed on the silicon substrate,
   wherein a trench is disposed within the first silicon oxide layer within the active region, the silicon nitride layer is at one side of the trench, a second silicon oxide layer is disposed at a bottom of the trench.

7. The fabricating method of reducing photoresist footing of claim 6, wherein the fluorination process is performed to the silicon substrate, the first silicon oxide layer, the silicon nitride layer, and the second silicon oxide layer, and wherein while forming the photoresist to contact the top surface of the silicon nitride layer, the photoresist also covers the active region and the peripheral region, and fills in the trench, and wherein while removing the photoresist contacting the silicon nitride layer, the photoresist covered the active region is also removed, and the photoresist covered the peripheral region is remained.

8. The fabricating method of reducing photoresist footing of claim 7, further comprising:
   after removing the photoresist, removing the second silicon oxide layer;
   forming a gate oxide layer at the bottom of the trench; and
   forming a gate electrode filling the trench.

9. The fabricating method of reducing photoresist footing of claim 7, further comprising:
   before forming the photoresist and after the fluorination process, performing a cleaning process to the silicon substrate, the first silicon oxide layer, the silicon nitride layer, and the second silicon oxide layer, wherein the cleaning process is performed by using a mixture of ammonium hydroxide, hydrogen peroxide, and water.

10. The fabricating method of reducing photoresist footing of claim 1, wherein the fluorination process comprises a chemical oxide removal (COR) process, a dilute HF wet etching process or a fluorine-containing plasma treatment.

11. The fabricating method of reducing footing of the photoresist of claim 1, wherein the photoresist comprises resin.

* * * * *